(12) United States Patent
Verma et al.

(10) Patent No.: US 11,315,630 B2
(45) Date of Patent: Apr. 26, 2022

(54) PARALLEL PORT ENABLEMENT IN PSEUDO-DUAL-PORT MEMORY DESIGNS

(71) Applicant: Synopsys, Inc., Mountain View, CA (US)

(72) Inventors: Praveen Kumar Verma, Noida (IN); Rohan Makwana, Noida (IN)

(73) Assignee: Synopsys, Inc., Mountain View, CA (US)

( * ) Notice: Subject to any disclaimer, the term of this patent is extended or adjusted under 35 U.S.C. 154(b) by 62 days.

(21) Appl. No.: 16/844,501

(22) Filed: Apr. 9, 2020

(65) Prior Publication Data
US 2020/0327932 A1 Oct. 15, 2020

(30) Foreign Application Priority Data

Apr. 9, 2019 (IN) .............................. 201911014226

(51) Int. Cl.
*G11C 7/22* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC .................................................. G11C 11/419
See application file for complete search history.

(56) References Cited

U.S. PATENT DOCUMENTS

| 7,797,610 | B1* | 9/2010 | Simkins | G11C 8/16 |
| | | | | 714/763 |
| 2007/0242554 | A1* | 10/2007 | Kim | G11C 7/22 |
| | | | | 365/230.05 |
| 2017/0117060 | A1* | 4/2017 | Sano | G11C 11/412 |
| 2017/0365332 | A1* | 12/2017 | Ecker | G11C 7/02 |

* cited by examiner

*Primary Examiner* — Min Huang
(74) *Attorney, Agent, or Firm* — Sterne, Kessler, Goldstein & Fox P.L.L.C.

(57) ABSTRACT

A pseudo-dual-port memory (PDPM) is disclosed that includes a first memory array bank and a second memory array bank of a plurality of memory array banks. The PDPM also includes parallel pin control logic circuitry configured to perform operations including taking a clock signal, a memory enable signal for a first port, a memory enable signal for a second port, a parallel pin control signal, and address signals for the first and the second memory array banks as inputs and generating a first internal clock and a second internal clock for performing operations corresponding to the first and the second memory array banks at the first port and the second port. A total number of memory array banks may be up to eight memory array banks and each including either a six-transistors (6-T) SRAM bit-cell or an eight-transistors (8-T) SRAM bit-cell in static random access memory architecture.

20 Claims, 11 Drawing Sheets

PARALLEL PORT ENABLEMENT IN PSEUDO-DUAL-PORT MEMORY DESIGNS

CROSS-REFERENCE TO RELATED APPLICATIONS

The present application claims the benefit of Indian Patent Application No. 201911014226 filed on Apr. 9, 2019, which is incorporated herein by reference in its entirety for all purposes.

TECHNICAL FIELD

This disclosure has significance in the field of electronic design automation in general, including the following topics: pseudo-dual-port memory (PDPM) architecture that enables simultaneous read and write operations.

BACKGROUND

With the advancement of high-speed computing devices, for example, in the field of video processing, a higher quality of image resolution is required, which further requires very diverse multiprocessing units. For multiprocessing, a dual-port memory cell that can perform read and write operations during the same cycle are required. The dual-port memory has dedicated ports for the read and write operations, for example, port A and port B may be dedicated for the write and read operations, respectively. Increasing the quality of image resolution or video processing may require an increase in pixel's data storage inside the memory. Accordingly, the memory area on the Graphics Processing Unit (GPU) is significantly increased.

There are two types of SRAM bit-cells: six transistors (6-T) single-port SRAM, and eight transistors (8-T) dual-port SRAM. The 8-T dual-port SRAM has separate ports for the read and write operations. Thus, 8-T dual-port SRAM can perform read and write operations simultaneously. However, compared to the 6-T single-port SRAM, the 8-T dual-port SRAM offers the benefit of simultaneous read and write operations but requires more circuit area.

There is another type of SRAM, which is known as pseudo-dual-port SRAM (PDPSRAM), that is used for multiprocessing applications. The PDPSRAM provides a capability similar to a dual-port SRAM. Notably, the PDPSRAM allows a sequential read and write operations in the same clock cycle. Further, the PDPSRAM provides the benefit in terms of static power savings and circuit area because the PDPSRAM uses 6-T SRAM architecture. However, the PDPSRAM has a degraded performance in comparison with the conventional single-port or dual-port SRAM. The performance degradation of the PDPSRAM arises because the cycle time of the PDPSRAM is the total of the time required for the read and write operations. Accordingly, when compared to the operation of the single-port or dual-port SRAM, the PDPSRAM is about 1.8 times slower.

DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to parallel port enablement in pseudo-dual-port memory (PDPM). In various aspects of the present disclosure, a pseudo-dual-port memory architecture is described that enables concurrent read and write operations. By way of a non-limiting example, the memory may be static random access memory (SRAM). Accordingly, the PDPM may be referenced in this disclosure as pseudo-dual-port static random access memory (PDPSRAM). Due to the concurrent read and write operations performed by the PDPSRAM, the PDPSRAM has a comparable performance gain compared to a single-port SRAM. This is so because the PDPSRAM, according to various aspects, as described in this disclosure, may enable independent write operations, so the write operation is not required to be held until a read operation is completed.

Further, the PDPSRAM, according to various aspects, as described in this disclosure, may also result in significantly lower dynamic power for completion of a write operation. The savings in dynamic power is because the concurrent write only operations limit the activity factor of internal read clock generation. The PDPSRAM, according to various aspects, can convert a single-port memory architecture into a parallel dual-port memory to achieve better performance compared to the dual-port memory without any circuit area overhead.

Figure 1:
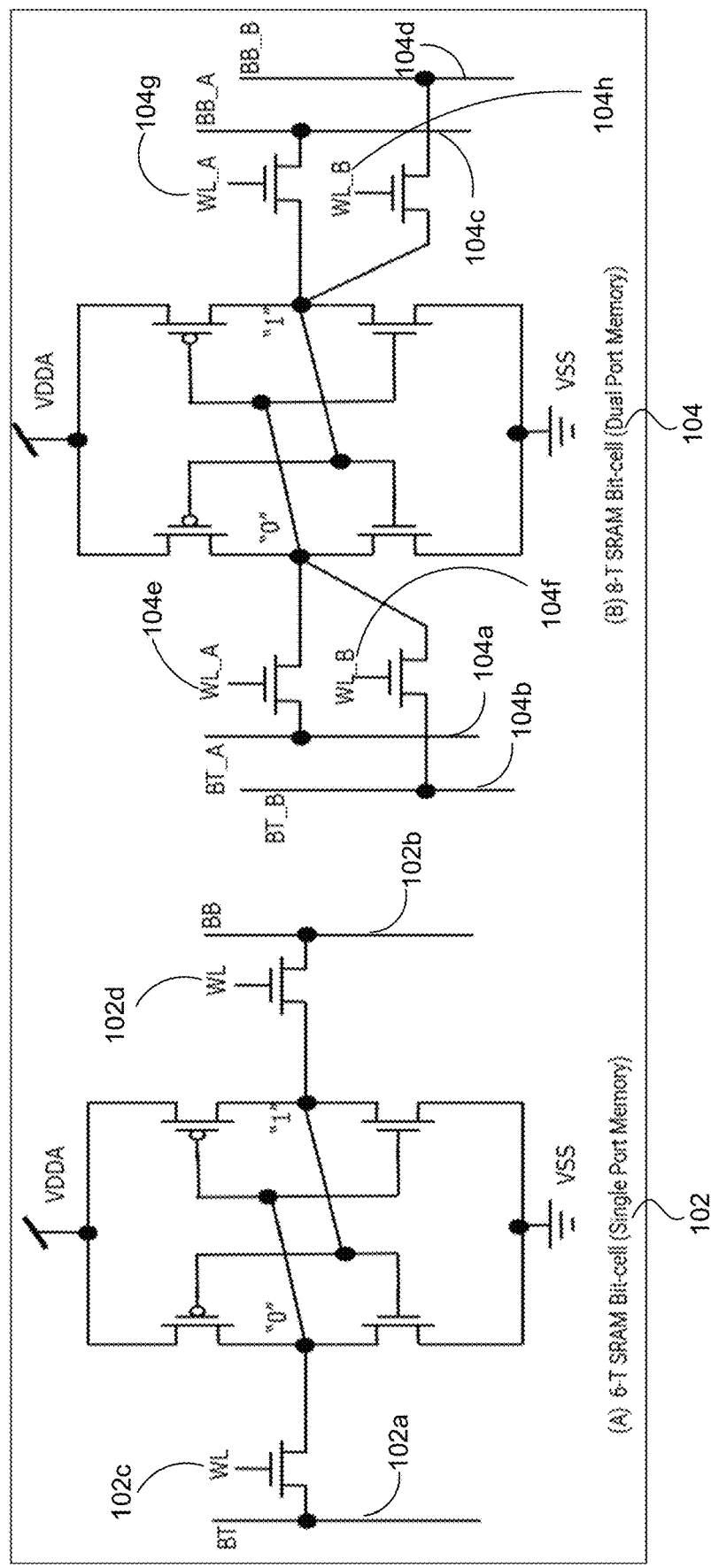
FIG. 1 illustrates a single-port SRAM bit-cell and a dual-port SRAM bit-cell.

FIG. 1 illustrates a single-port SRAM bit-cell and a dual-port SRAM bit-cell. As shown in FIG. 1, a conventional six-transistor (6-T) SRAM bit-cell 102 has a single-port, which is coupled with bit-lines BT 102a and BB 102b through its ports and controlled by wordline (WL) 102c and 102d to perform read or write operation at a given address in the same cycle. A single-port SRAM is a type of memory in which a different clock cycle is required for the read operation and the write operation. As shown in FIG. 1, the 6-T SRAM bit-cell includes a pair of weakly cross-coupled inverters and a pair of access transistors. As shown in FIG. 1, a conventional eight-transistor (8-T) dual-port SRAM bit-cell 104 has two ports with two dedicated pass gates, and with two sets of bit-lines. The two sets of bit-lines correspond to a port A and a port B, in which bit-lines BT_A 104a and BB_A 104c correspond with the port A and bit-lines BT_B 104b and BB_B 104d correspond with the port B. The two sets of bit-lines are controlled by two wordlines, WL_A 104e and 104g and WL_B 104f and 104h. In this case, through the port A and the port B, the dual-port memory cell can perform read operation and write operation concurrently in the same cycle.

Figure 2:
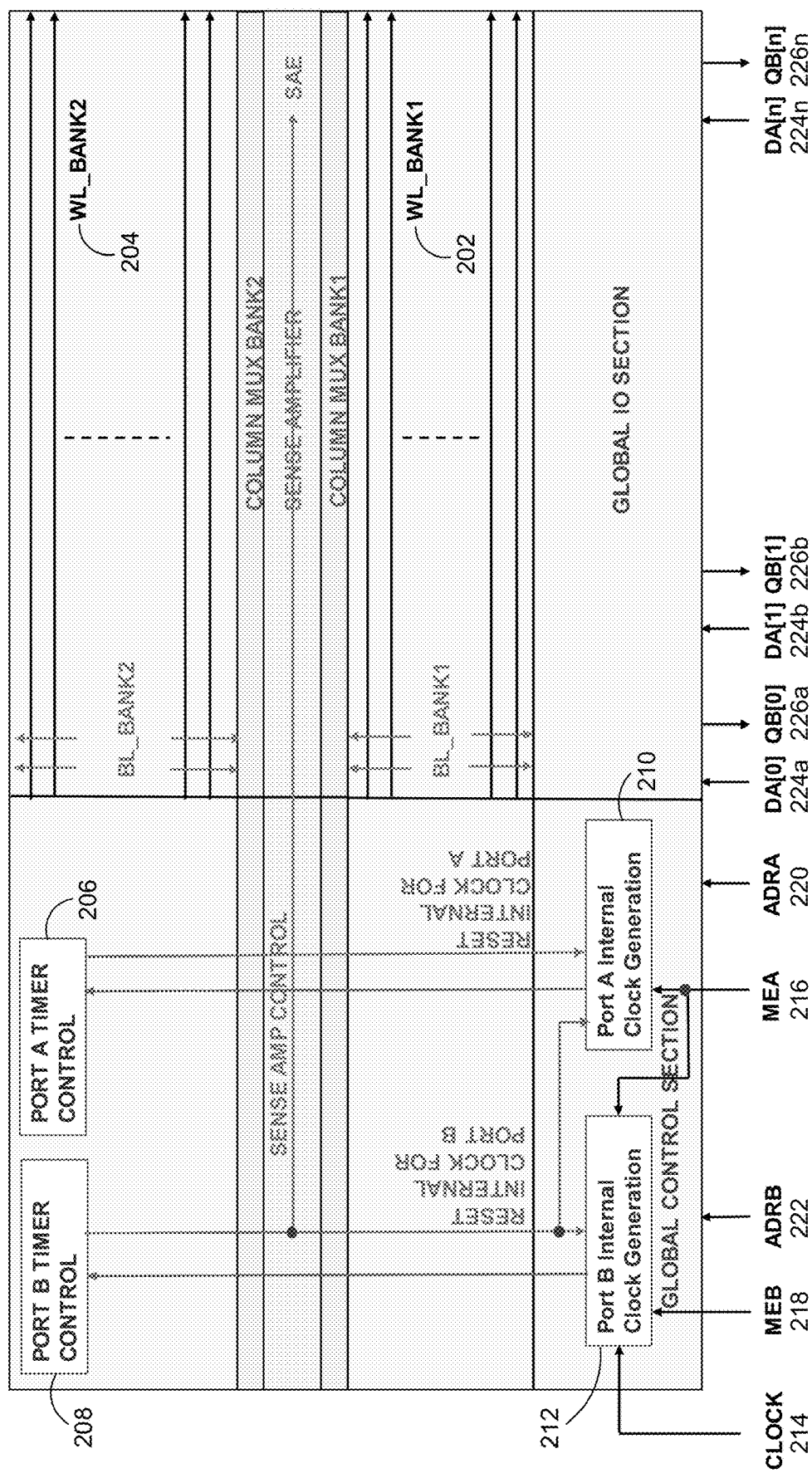
FIG. 2 illustrates a block diagram of conventional multi-bank pseudo-dual-port memory architecture where port A and port B are dedicated to write operation and read operation, respectively.

FIG. 2 illustrates a block diagram of a conventional multi-bank pseudo-dual-port memory architecture where port A and port B are dedicated to write operation and read operation, respectively. The conventional multi-bank memory architecture shown in FIG. 2 includes two banks, bank1 and bank2. Wordlines for the bank1 and bank2 are shown as WL_BANK1 202 and WL_BANK2 204, and bit-lines for the bank1 and bank2 are shown as BL_BANK1 and BL_BANK2, respectively. The conventional multi-bank pseudo-dual-port memory architecture also includes a sense amplifier and a sense amplifier control circuit shared by the two banks. In multi-bank architecture, for the read or the write operation, reading or writing bits of the accessed cell is selected based on a column multiplexer (mux) and decoded row addresses. In this case, the column mux, bank address, and row address information are stored in the ADRA bus 220 and ADRB bus 222.

A global 10 section may include input signals, for example, DA[0], DA[1], . . . DA[n], as 224a, 224b, . . . 224n, respectively, for the write operation, and output signals, for example, QB[0], QB[1], . . . QB[n], as 226a, 226b, . . . 226n, respectively, for the read operation. Signals DA[0], DA[1] . . . DA[n] 224a, 224b . . . 224n may correspond to port A and QB[0], QB[1] . . . QB[n] 226a, 226b . . . 226n may correspond to port B. Thus, port A may be reserved for the write operation, and the port B may be reserved for the read operation. Accordingly, the port B may be selected for the read operation when the memory enable (ME) signal for port B, i.e., MEB 218, is high, which, for example, maybe at level 1 or ON. In addition, the port A may be selected for the write operation when the ME signal for port A, i.e., MEA 216, is high, which, for example, maybe at level 1 or ON. Similarly, no operation corresponding to the port A and/or the port B may be allowed when the MEA 216 and/or the MEB 218 may be low, which, for example, maybe at level 0 or OFF.

The access address location of memory for the port A and the port B is provided by signals for the ADRA bus 220 and the ADRB bus 222. Accordingly, for the read operation, the port B may be selected, and the accessed bit-cells may pass the data into the sense amplifier. After sensing the correct data, the output of the sense amplifier may be latched inside the global IO section. Similarly, for the write operation, the port A may be selected, and the input data may be latched in the global IO section, which is written into the accessed bit-cells, The read operation and the write operation are performed according to internal clock signals generated by a port A internal clock generation block 210 and a port B internal clock generation block 212 using a clock signal 214 generated by a clock. The internal clock signals generated by the port A internal clock generation block 210 and the port B internal clock generation block 212 are set and reset according to port A timer control 206 and port B timer control 208, respectively.

Figure 3:
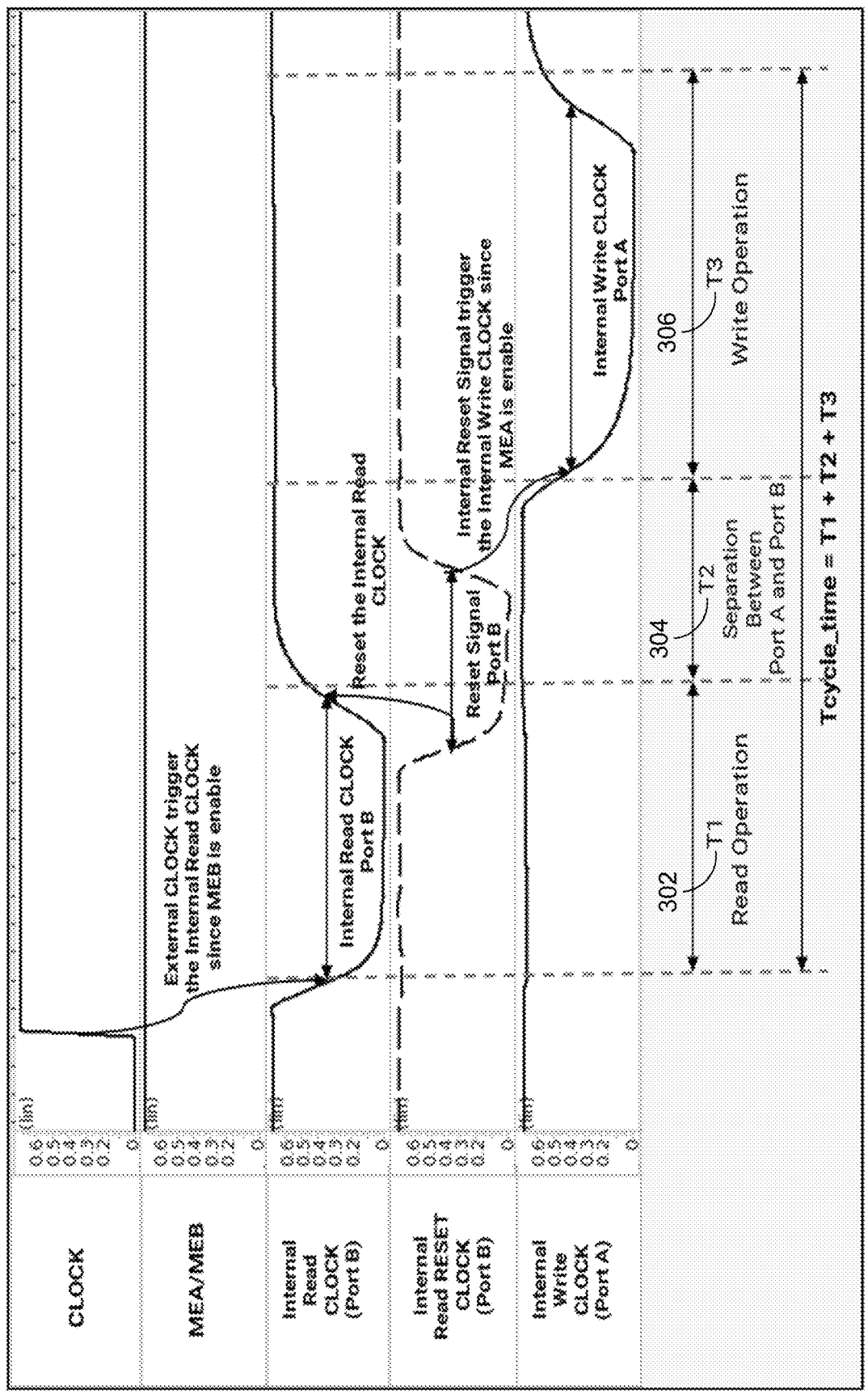
FIG. 3 illustrates a conventional pseudo-dual-port internal clock generation timing waveforms for port A and port B.

FIG. 3 illustrates conventional pseudo-dual-port internal clock generation timing waveforms for port A and port B. When the MEA 216 and the MEB 218 are at level 1 or active HIGH, then an internal read clock is generated at the rising edge of the clock signal 214. The internal read clock is reset through the port B timer control 208. The port B timer control 208 tracks the wordline, and the bit-line discharges. The reset of the internal read clock triggers the internal clock for the port A. The internal write clock for the port A is reset through the port A timer control 206. Accordingly, the internal clock generation for the port A is in a sequential manner, as shown in FIG. 3, as T1 read operation 302 and T3 write operation 306, respectively. Further, as shown in FIG. 3, the read operation and the write operation are separated for a T2 separation time 304 between the port B and the port A to achieve better marginality and functionality of the read operation and the write operation. Accordingly, compared to the single-port memory, the overall cycle time of the pseudo-dual-port memory is almost 1.8 to 1.6 times less.

Figure 4:
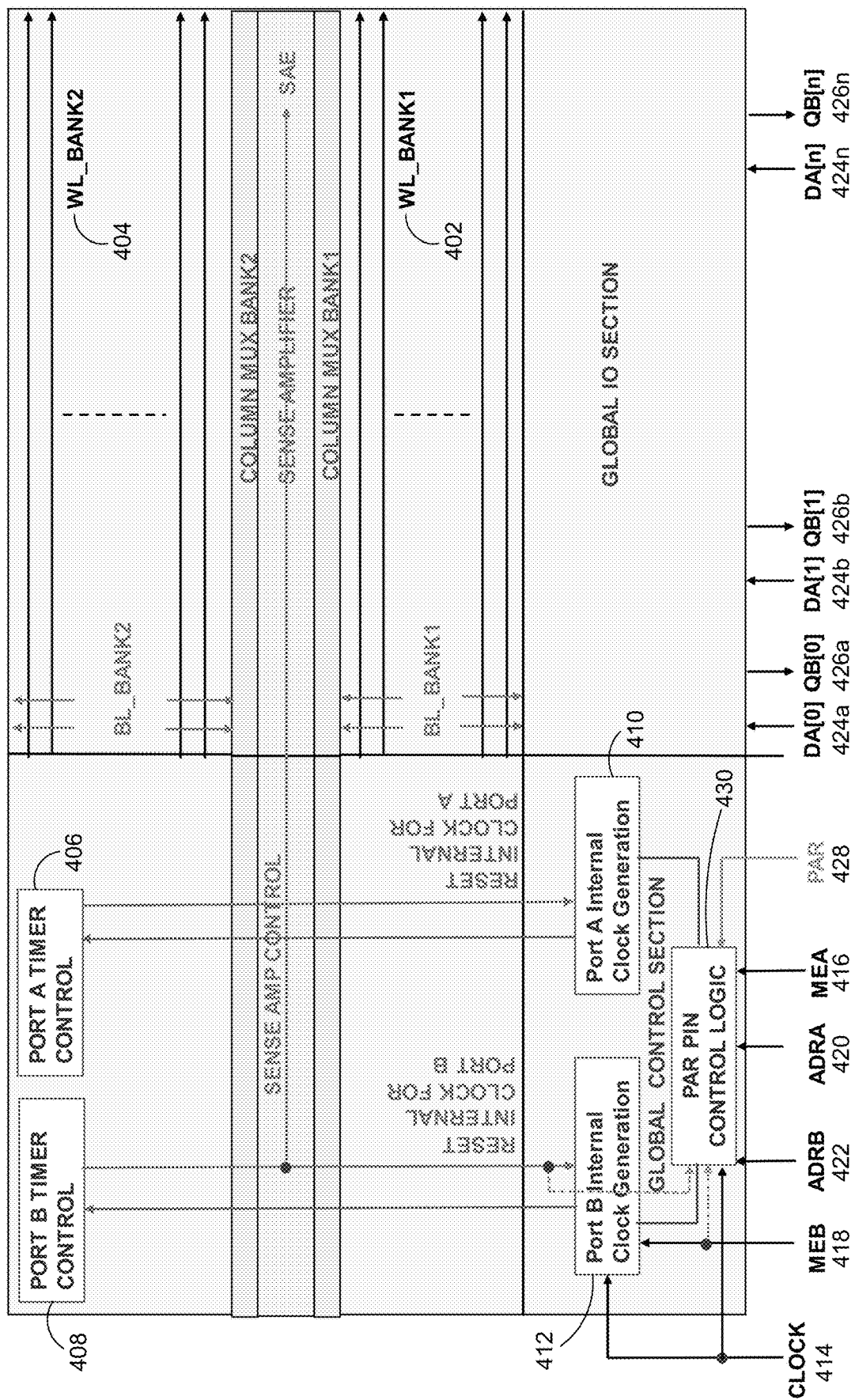
FIG. 4 illustrates a block-level implementation of a configurable parallel (PAR) pseudo-dual-port multi-bank memory architecture, according to an exemplary aspect of the present disclosure.

FIG. 4 illustrates a block-level implementation of a configurable parallel (PAR) pseudo-dual-port multi-bank memory architecture, according to an exemplary aspect of the present disclosure. As shown in FIG. 4, the configurable PAR pseudo-dual-port multi-bank architecture may include two banks, bank1 and bank2. Wordlines for the bank1 and bank2 are shown as WL_BANK1 402 and WL_BANK2 404, and bit-lines for the bank1 and bank2 are shown as BL_BANK1 and BL_BANK2, respectively. The configurable PAR pseudo-dual-port multi-bank memory architecture also includes a sense amplifier and a sense amplifier control circuit shared by the two banks. In multi-bank architecture, for the read or write operation, reading or writing bits of the accessed cell is selected based on a column multiplexer (mux) and decoded row addresses. In this case, the column mux, bank address, and row address information are stored in the ADRA bus 420 and ADRB bus 422.

In some aspects, a global IO section may include input signals, for example, DA[0], DA[1], . . . DA[n], as 424a, 424b, . . . 424n, respectively, for the write operation, and output signals, for example, QB[0], QB[1], . . . QB[n], as 426a, 426b, . . . 426n, respectively, for the read operation. Signals DA[0], DA[1] . . . DA[n] 424a, 424b . . . 424n may correspond to port A and QB[0], QB[1] . . . QB[n] 426a, 426b . . . 426n may correspond to port B. Thus, port A may be reserved for the write operation, and the port B may be reserved for the read operation. Accordingly, the port B may be selected for the read operation when the memory enable (ME) signal for port B, i.e., MEB 418, is high, which, for example, maybe at level 1 or ON. In addition, the port A may be selected for the write operation when the ME signal for port A, i.e., MEA 416, is high, which, for example, maybe at level 1 or ON. Similarly, no operation corresponding to the port A and/or the port B may be allowed when the MEA 416 and/or the MEB 418 is low, which, for example, maybe at level 0 or OFF.

In some aspects, the access address location of memory for the port A and the port B may be provided by signals for the ADRA bus 420 and the ADRB bus 422. Accordingly, for the read operation, the port B may be selected, and the accessed bit-cells may pass the data into the sense amplifier.

After sensing the correct data, the output of the sense amplifier may be latched inside the global IO section. Similarly, for the write operation, the port A may be selected. The input data may be latched in the global IO section, which is written into the accessed bit-cells. The read operation and the write operation may be performed according to internal clock signals generated by a port A internal clock generation block 410 and a port B internal clock generation block 412 using a clock signal 414 generated by a clock. The internal clock signals generated by the port A internal clock generation block 410 and the port B internal clock generation block 412 are may be set and reset according to a port A timer control 406 and a port B timer control 408, respectively.

In some aspects, a PAR pin control logic circuitry 430 may take the MEA 416, the MEB 418, the ADRB 420, the ADRB 422, the clock signal 414, and a PAR pin control signal 428 as its inputs to control the port A and the port B for the write operation and the read operation, respectively. Particularly, in this case, the port A and the port B are directly controlled by the PAR pin control signal 428. The port A and the port B may be controlled by the PAR pin control signal 428 in response to the rising edge of the clock signal 414. The PAR pin control logic circuitry 430 may enable the write operation at the port A at the rising edge of the clock signal 414 to be performed concurrently along with the read operation at the port B. Internal clock parallelism for an internal clock for the port A, and an internal clock for the port B may improve the performance of the memory. In the conventional pseudo-dual-port memory architecture as shown in FIG. 2, the write operation at the port A is triggered when an internal clock for the port B resets. Instead, in this case, both the port A and the port B may be enabled for the read and write operations at the rising edge of the clock signal 414. A clock external to the PAR pin control logic circuitry 430 or the configurable PAR pseudo-dual-port multi-bank memory architecture may provide the clock signal 414 for concurrent operation for the port A and the port B.

Figure 5:
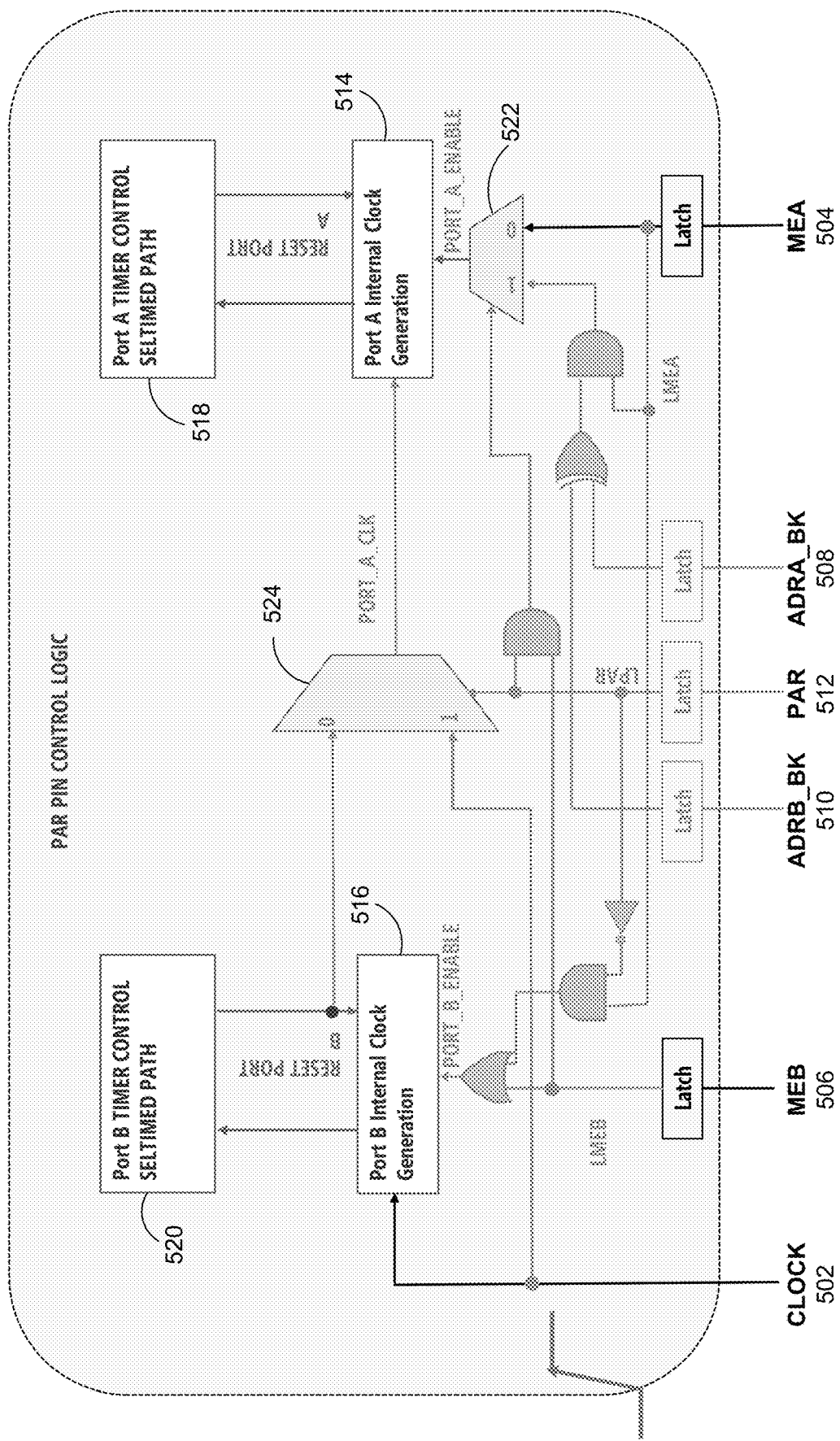
FIG. 5 illustrates a block diagram of a PAR pin control logic circuitry in accordance with some aspects of the present disclosure.

FIG. 5 illustrates a block diagram of a PAR pin control logic circuitry in accordance with some aspects of the present disclosure. The PAR pin control logic circuitry 430 may be subdivided into two parts, as shown in FIG. 5. The PAR pin control logic circuitry 430 may include a port A internal clock generator 514, a port B internal clock generator 516, a port A timer controller 518, and a port B timer controller 520. The PAR pin control logic circuitry 430 may take a clock signal 502, address input signals for the port A 508, address input signals for the port B 510, a memory enable signal for the port A (MEA) 504, a memory enable signal for the port B (MEB) 506, and PAR pin control signal 512 as its inputs.

In some aspects, the PAR pin control logic circuitry 430, as shown in FIG. 5, may include multiplexers 522 and 524, latches and a comparator logic to support the parallel operation for the port A and the port B. As shown in FIG. 5, an output of the multiplexer 522 may act as an enable signal for the port A, and an output of the multiplexer 524 may control the propagation of the clock signal 514 for the port A. If the PAR pin control signal 512 is high or at level 1 or ON, the output of the multiplexer 524, which is a clock for the port A, i.e., PORT_A_CLK, may pass the clock signal 502 to the port A internal clock generator 514. If the PAR pin control signal 512 is active LOW then the regular operation may take place, i.e., the port B resetting signal may be passed to generate the internal clock for the port A. The multiplexer 522 may control the enable signal, i.e., POR-T_A_ENABLE signal, which is an output of the multiplexer 522, for the port A internal clock generator 514. One of the inputs to the multiplexer 522 may be a comparator output of latched bank address for the port A and the port B that ensures that when both the PAR pin control signal 512 and the MEA 504 are active HIGH, the operations on the port A and the port B may take place concurrently for the different banks, for example, bank1 and bank2. Similarly, when the PAR pin control signal 512 is active LOW, then only MEA 504 may be transferred through other input of the multiplexer 522.

Figure 6:
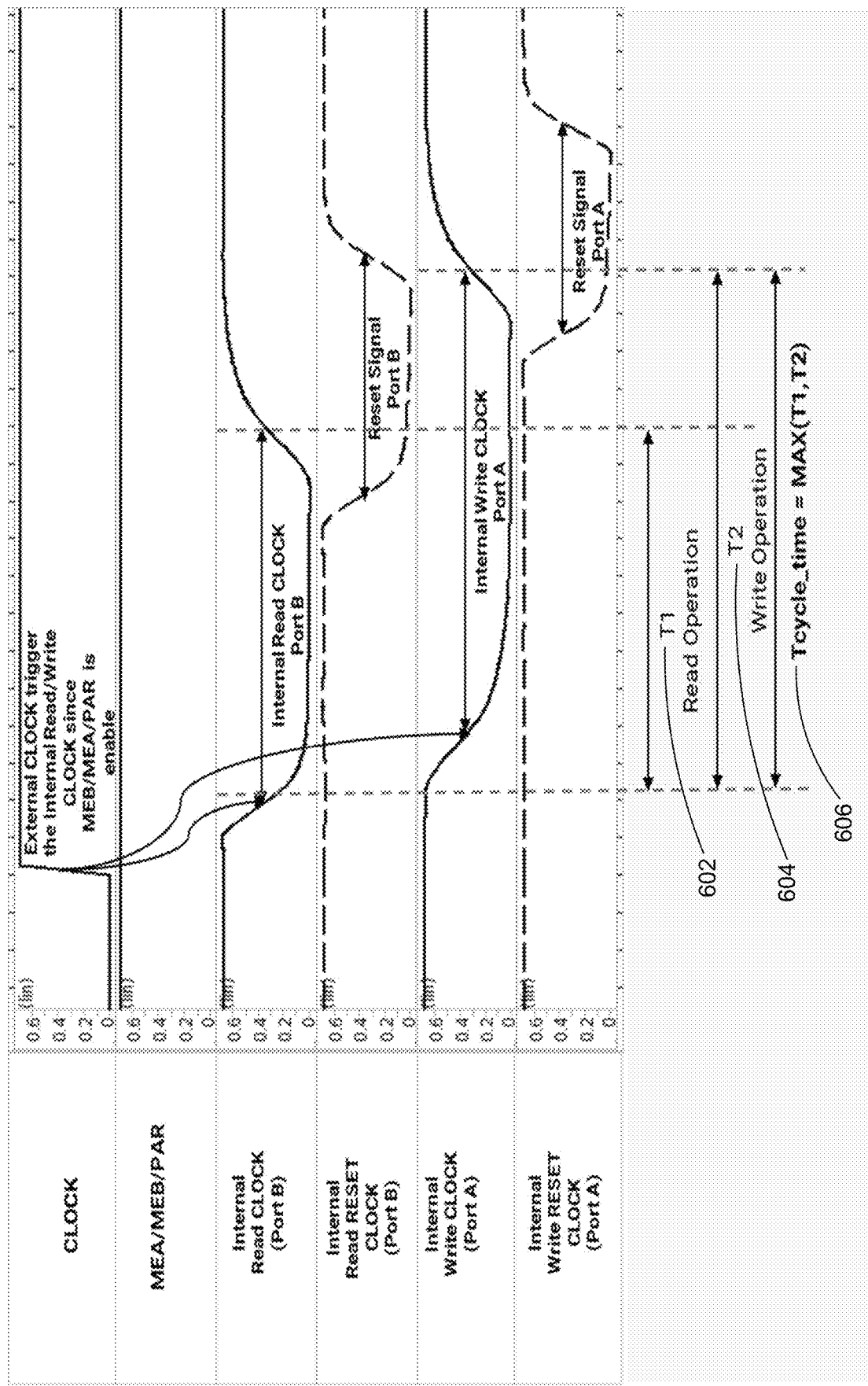
FIG. 6 illustrates internal clock waveforms for port A and port B for the configurable PAR pseudo-dual-port multi-bank memory architecture in accordance with some aspects of the present disclosure.

FIG. 6 illustrates internal clock waveforms for the port A and the port B for the configurable PAR pseudo-dual-port multi-bank memory architecture in accordance with some aspects of the present disclosure. As shown in FIG. 6, when the PAR pin control signal 512, the MEA 504, and the MEB 506 are at level 1 or active HIGH, then the internal read clock and the internal write clock may be generated by the port B internal clock generator 516 and the port A internal clock generator 514, respectively. The internal read clock and the internal write clock may be generated at the rising edge of the clock signal 502. Accordingly, the port A and the port B may be used to concurrently access different banks, for example, bank1 and bank2. As shown in FIG. 6, T1 602 corresponds to the read operation for the port B, and T2 604 corresponds to the write operation for the port A. Accordingly, the overall cycle time with the PAR pin control logic circuitry 430 is the maximum of T1 602 and T2 604. Based on the comparison, the overall cycle time for the configurable PAR pseudo-dual-port multi-bank memory architecture is almost 50 percent less compared to the conventional multi-bank pseudo-dual-port memory architecture. The following table shows what operations may be performed corresponding to the PAR pin control signal 512, the MEA 504, and the MEB 506.

TABLE 1

Control Logic Operations for the Configurable PAR Pseudo-Dual-Port Multi-Bank Memory Architecture

| External PIN | | | Control Logic Read Bank Address (Port B) Same as the Write Bank Address (Port A) | Cycle Operation | |
|---|---|---|---|---|---|
| PAR | MEA | MEB | | Port A | Port B |
| 1 | 0 | 0 | No | No Operation | No Operation |
| 1 | 0 | 1 | No | No Operation | Parallel Read |
| 1 | 1 | 0 | No | Parallel Write | No Operation |
| 1 | 1 | 1 | No | Parallel Write | Parallel Read |
| 1 | 0 | 0 | Yes | No Operation | No Operation |
| 1 | 0 | 1 | Yes | No Operation | Parallel Read |
| 1 | 1 | 0 | Yes | Parallel Write | No Operation |
| 1 | 1 | 1 | Yes | No Operation | Parallel Read |
| 0 | 0 | 0 | X | No Operation | No Operation |
| 0 | 0 | 1 | X | No Operation | Read |
| 0 | 1 | 0 | X | Sequential Write | No Operation |
| 0 | 1 | 1 | X | Sequential Write | Read |

Figure 7:
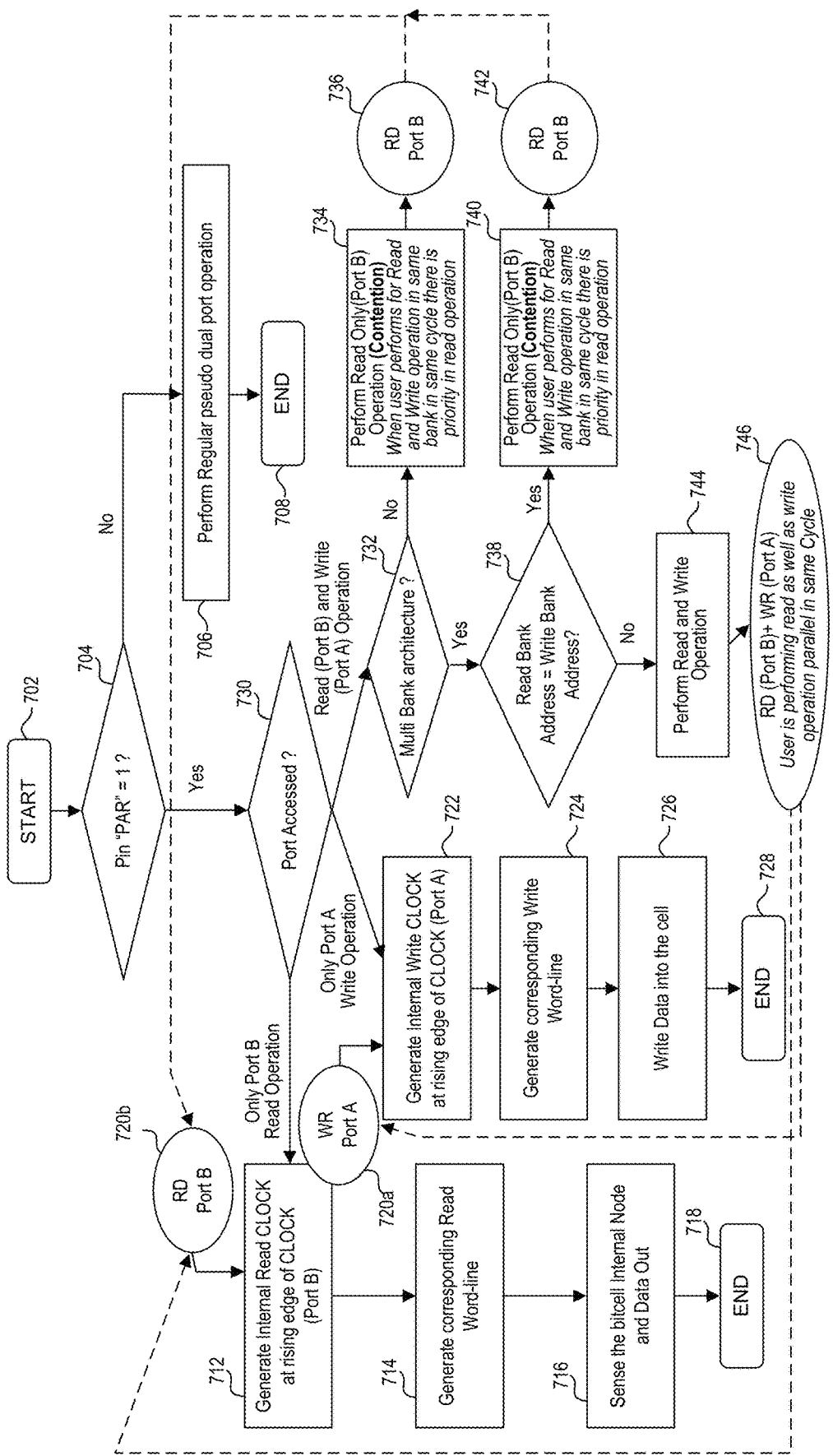
FIG. 7 illustrates a flowchart for operations performed by the configurable PAR pseudo-dual-port multi-bank memory architecture in accordance with some aspects of the present disclosure.

FIG. 7 illustrates a flowchart for operations performed by the configurable PAR pseudo-dual-port multi-bank memory architecture in accordance with some aspects of the present disclosure. The flowchart may start at step 702, and may determine if the PAR pin control signal 512 is active HIGH or at level 1 or ON at step 704. If the PAR pin control signal is determined as active LOW or at level 0 or OFF, then a regular pseudo-dual-port operation may be performed as shown by step 706, and the flowchart may end at step 708.

In some aspects, at step 704, if the PAR pin control signal 512 is active HIGH or at level 1 or ON then as shown above with reference to Table 1, the configurable PAR pseudo-dual-port multi-bank architecture shown in FIG. 4 and FIG. 5, may operate under the following scenarios: write-only operation, read-only operation, concurrent read and write operations. As shown in FIG. 7, which port or ports to be accessed may be determined at step 730, and based on the determination made at step 730, the write-only operation, the read-only operation, and the concurrent read and write operations may be performed.

In some aspects, write-only operation 720a may be performed when the MEA 504 is active HIGH or at level 1 or ON, and the MEB 506 is active LOW or at level 0 or OFF. As described above, the port A may be dedicated for write operations. In the conventional pseudo-dual-port memory architecture, as shown in FIG. 2, an internal clock for the port A is triggered when the internal clock for the port B is reset. However, for the configurable PAR pseudo-dual-port multi-bank memory architecture, as shown in FIG. 4 and FIG. 5, the internal clock for the port A may be triggered with the rising edge of the clock signal 502 at step 722. Accordingly, write operation may be enabled independently and may not be required to wait for the read operation to complete, thereby saving dynamic power, which would otherwise be consumed during the write operation. Accordingly, at step 724, a wordline may be enabled for the write operation. At step 726, the latched data received at the DA[0], DA[1] . . . DA[n] 424a, 424b . . . 424n may be written into the memory cells depending on the access cells' addresses. The port A timer controller 518 may generate a RESET signal to reset the internal clock for the port A. When the internal clock for the port A is reset, the selected wordline may be turned off along with the column multiplexers, the address input signals for the port A 508. Accordingly, the data bus latches may become transparent for the next cycle operation at step 728.

In some aspects, read-only operation 720b may be performed when the MEA 504 is active LOW or at level 0 or OFF, and the MEB 506 is active HIGH or at level 1 or ON. As described above, the port B may be dedicated to read operations. In the configurable PAR pseudo-dual-port multi-bank memory architecture, as shown in FIG. 4 and FIG. 5, and the conventional pseudo-dual-port memory architecture, as shown in FIG. 2, an internal clock for the port B is triggered with the rising edge of the clock signal 502 at step 712. At step 714, a wordline for the read operation may be enabled. At step 716, column muxes depending on the accessed cells' addresses, data corresponding to stored bits inside the memory cells may be read. The port B timer controller 520 may generate a RESET signal to reset the internal clock for the port B. At step 718, since the internal clock for the port B is reset, the selected wordline and column muxes are also reset, and the address input signals for the port B 510 may become transparent for next cycle operation.

In some aspects, when the MEA 504 and the MEB 506 both are active HIGH or at level 1 or ON, and the PAR pin control signal 512 is also active HIGH or at level 1 or ON, then depending on the memory bank architecture, for example, a multi-bank architecture or a single bank architecture, the following operations may be performed depending on the address input signals for the port B 510 and the address input signals for the port A 508. In the multi-bank architecture, the memory can be divided into arrays of the bit-cells, which can be further subdivided into different chunks, known as banks, that can be accessed through a dedicated bank address bank such as the address input signals for the port B 510 and the address input signals for the port A 508. By way of a non-limiting example, there may be up to eight banks specifically for SRAM in the configurable PAR pseudo-dual-port multi-bank memory architecture, as shown in FIG. 4 and FIG. 5.

In some aspects, at step 732, if it is determined that the memory is not a multi-bank architecture, then as shown in FIG. 7, at step 734, a read operation is performed at the port B followed by a write operation at the port A. Thus, the read operation is given a priority over the write operation when the read operation and the write operation both are performed in the same cycle. The read operation, as shown as step 736, may be performed as discussed above with reference to steps 720b, 712, 714, 716, and 718. In a single-bank memory architecture, the address input signals for the port A 508 is the same as the address input signals for the port B 510, and, therefore, the read operation is given priority over the write operation.

In some aspects, at step 732, if it is determined that the memory is a multi-bank architecture, then as shown in FIG. 7, at step 738, the address input signals for the port A 508 may be compared to the address input signals for the port B 510. If the comparison at step 738 suggests the address input signals for the port A 508 is same as the address input signals for the port B 510 then at step 740, similar to step 734, a read operation is performed at the port B followed by a write operation at the port A. By way of a non-limiting example, the read operation is given a priority over the write operation when the read operation and the write operation both are performed in the same cycle. For the same bank operations, priority is given to the read operation at the port B to ensure no corruption of data inside the memory cell. Therefore, even though the port A is enabled for the write operation, no write operation is performed at the port A. The read operation, as shown as step 742 may be performed as discussed above with reference to steps 720b, 712, 714, 716, and 718. However, if the comparison at step 738 suggests the address input signals for the port A 508 is different from the address input signals for the port B 510, the read operation and the write operation may be performed concurrently on the different banks, as shown in FIG. 7, as step 744. The read operation and the write operation may be performed concurrently at step 746 because there is no contention issue. Further, there is no contention issue because the read and write operations are being performed on different banks. The concurrent read and write operations may be performed with reference to steps 720b, 712, 714, 716, and 718 for the read operation and steps 720a, 722, 724, 726, and 728 for the write operation, as discussed above.

Figure 8:
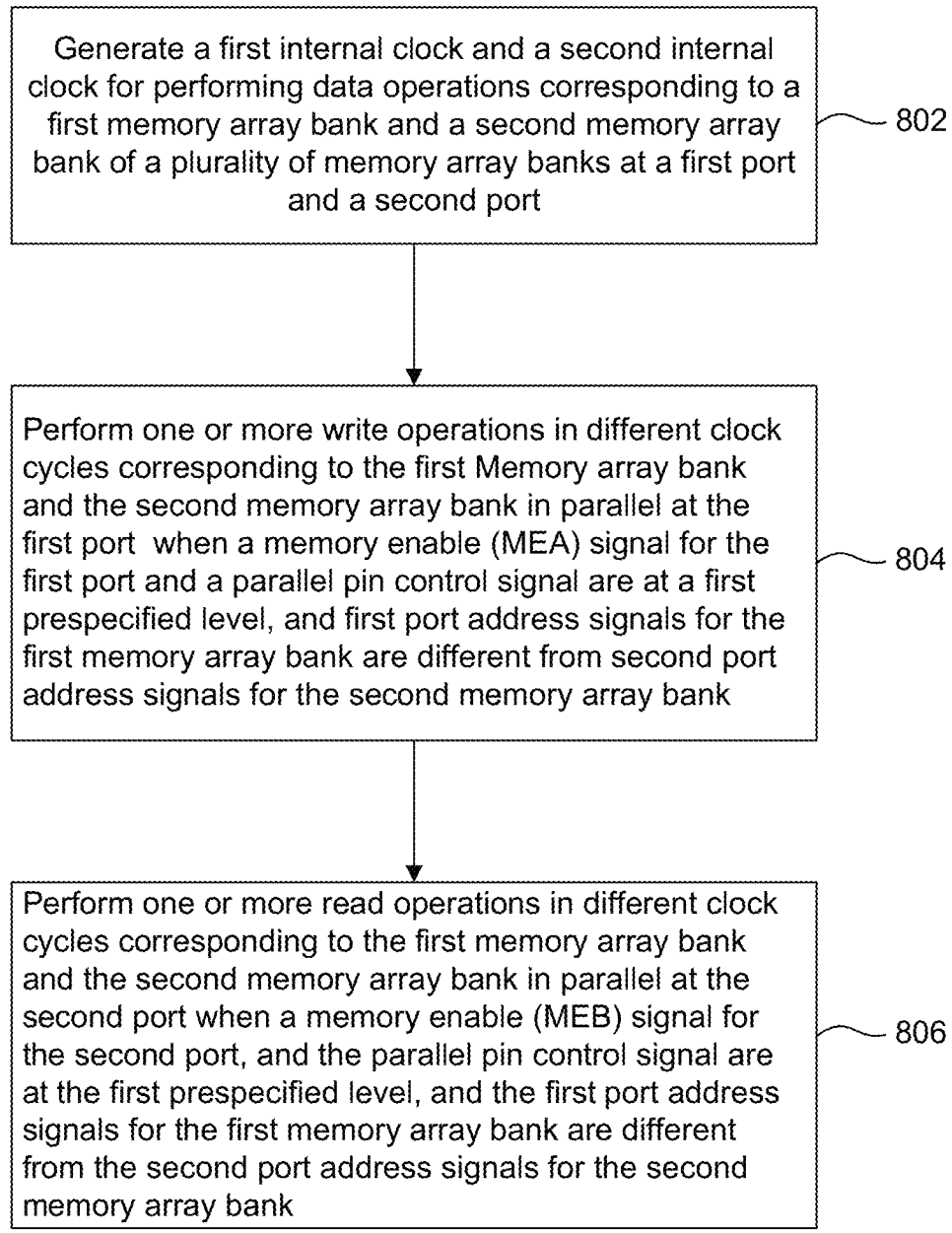
FIG. 8 illustrates another flowchart for method steps performed by the configurable PAR pseudo-dual-port multi-bank memory architecture in accordance with some aspects of the present disclosure.

FIG. 8 illustrates another flowchart for method steps performed by the configurable PAR pseudo-dual-port multi-bank memory architecture in accordance with some aspects of the present disclosure. At step 802, for the multi-bank architecture of two banks, a first internal clock for a first port and a second internal clock for a second port may be generated for performing operations, including read and/or write operations, corresponding to a first memory array bank and a second memory array bank of a plurality of memory array banks. By way of a non-limiting example, there may be up to eight banks in the multi-bank architecture specific to SRAM. As described above, read operation may be performed at the second port, for example, the port B, and write operation may be performed at the first port, for example, the port A.

In some aspects, at step 804, one or more write operations corresponding to the first memory array bank or the second memory array bank may be performed at the first port (the port A) when the memory enable signal for the first port (the port A), the memory enable signal for the second port (the port B), and a parallel pin control signal all are at a first prespecified level. The first prespecified level may be active HIGH, at level 1, or ON, and address signals for the first port for the first memory array bank are different from address signals for the second port for the second memory array bank.

In some aspects, at step 806, one or more read operations corresponding to the first memory array bank or the second memory array bank may be performed at the second port (the port B) when the memory enable signal for the second port (the port B), and a parallel pin control signal all are at a first prespecified level. The first prespecified level may be active HIGH, at level 1, or ON, and address signals for the first port for the first memory array bank are different from address signals for the second port for the second memory array bank.

Figure 9:
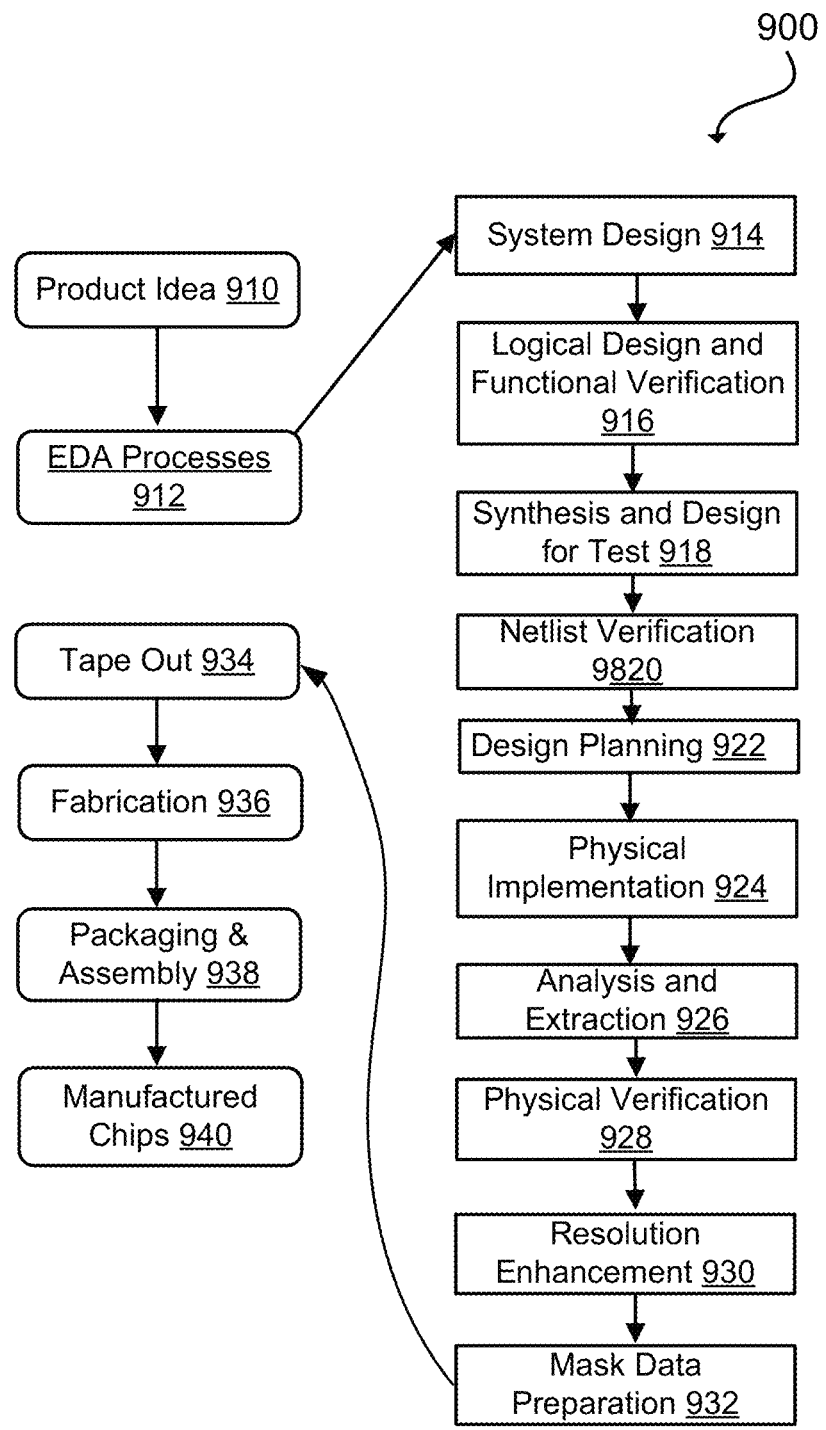
FIG. 9 illustrates a flowchart of various processes used during the design and fabrication of an integrated circuit, according to an exemplary aspect of the present disclosure.

FIG. 9 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information that is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936, and packaging and assembly processes 938 are performed to produce the finished integrated circuit 940.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 9. The processes described by being enabled by EDA products (or tools).

During system design 914, the functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During the logic design and functional verification 916, modules or components in the circuit are specified in one or more description languages, and the specification is checked for functional accuracy. For example, the components of the circuit may be verified to generate outputs that match the requirements of the specification of the circuit or system being designed. Functional verification may use simulators and other programs such as test bench generators, static HDL checkers, and formal verifiers. In some embodiments, special systems of components referred to as 'emulators' or 'prototyping systems' are used to speed up the functional verification.

During synthesis and design for test 918, HDL code is transformed into a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for the production of lithography masks. During mask data preparation 932, the 'tape-out' data is used to produce lithography masks that are used to produce finished integrated circuits.

A storage subsystem of a computer system (such as computer system 1100 of FIG. 11, or host system 1007 of FIG. 10) may be used to store the programs and data structures that are used by some or all of the EDA products described herein, and products used for the development of cells for the library and for the physical and logical design that use the library.

Figure 10:
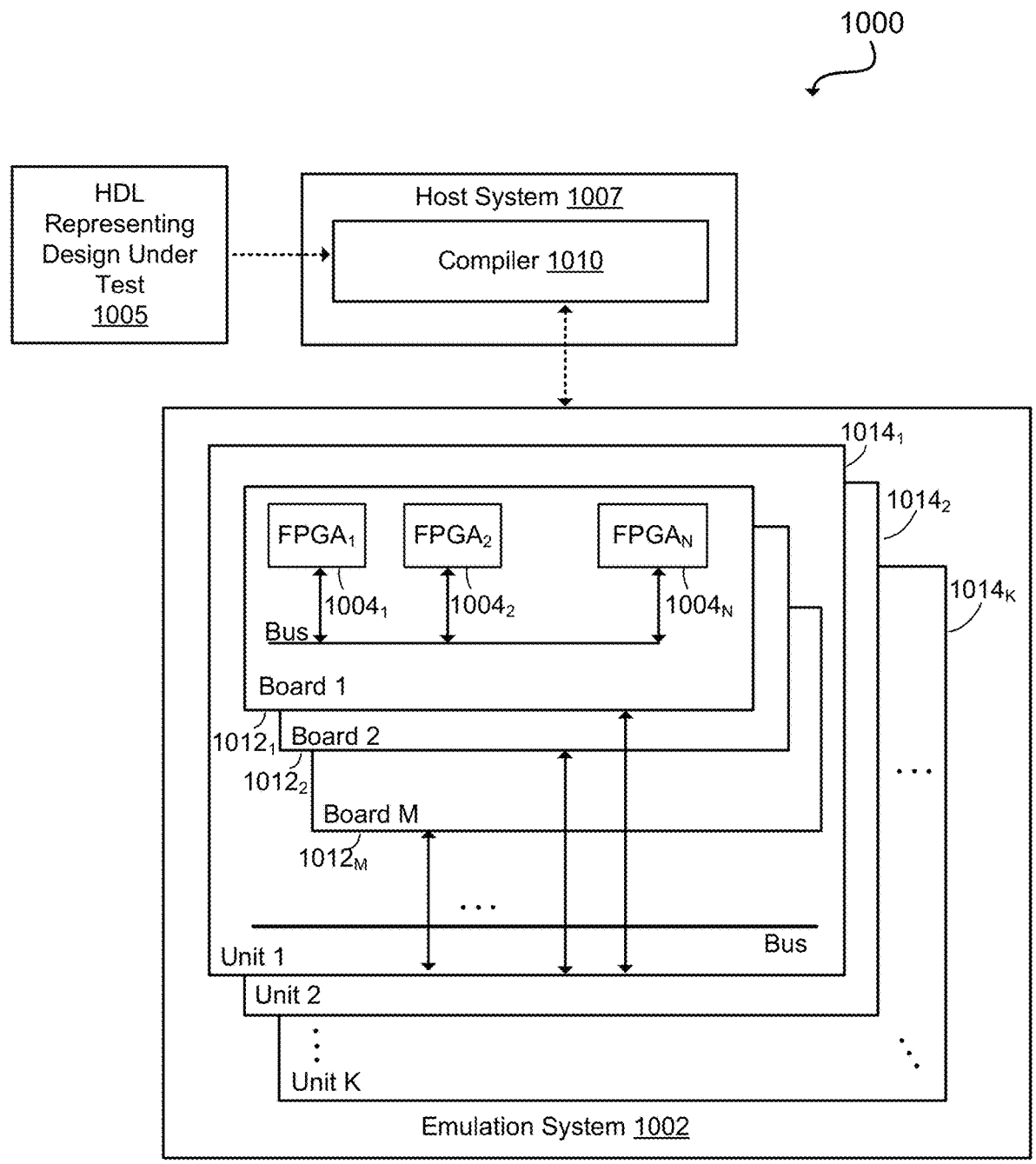
FIG. 10 illustrates an abstract diagram of an example emulation system in accordance with some aspects of the present disclosure.

FIG. 10 depicts an abstract diagram of an example emulation environment 1000. An emulation environment 1000 may be configured to verify the functionality of the circuit design. The emulation environment 1000 may include a host system 1007 (e.g., a computer that is part of an EDA system) and an emulation system 1002 (e.g., a set of programmable devices such as Field Programmable Gate Arrays (FPGAs) or processors). The host system generates data and information by using a compiler 1010 to structure the emulation system to emulate a circuit design. Circuit design to be emulated is also referred to as a Design Under Test ('DUT') where data and information from the emulation are used to verify the functionality of the DUT.

The host system 1007 may include one or more processors. In the embodiment where the host system includes multiple processors, the functions described herein as being performed by the host system can be distributed among the multiple processors. The host system 1007 may include a compiler 1010 to transform specifications written in a description language that represents a DUT and to produce data (e.g., binary data) and information that is used to structure the emulation system 1002 to emulate the DUT. The compiler 1010 can transform, change, restructure, add new functions to, and/or control the timing of the DUT.

The host system 1007 and emulation system 1002 exchange data and information using signals carried by an emulation connection. The connection can be but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 1007 and emulation system 1002 can exchange data and information through a third device such as a network server.

The emulation system 1002 includes multiple FPGAs (or other modules) such as FPGAs $1004_1$ and $1004_2$, as well as additional FPGAs to $1004_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 1002 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $1004_1$-$1004_N$ may be placed onto one or more boards $1012_1$ and $1012_2$ as well as additional boards through $1012_M$. Multiple boards can be placed into an emulation unit $1014_1$. The boards within an emulation unit can be connected using the backplane of the emulation unit or any other types of connections. In addition, multiple emulation units (e.g., $1014_1$ and $1014_2$ through $1014_K$) can be connected to each other by cables or any other means to form a multi-emulation unit system.

For a DUT that is to be emulated, the host system 1007 transmits one or more bit files to the emulation system 1002. The bit files may specify a description of the DUT and may further specify partitions of the DUT created by the host system 1007 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1007 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate-level netlist using the DUT description. A host system can use the netlist of the DUT to partition the DUT into multiple partitions, where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT, which includes interface signals and states of interface signals that have been traced by the trace and injection logic of each FPGA.

The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In the case of multiple re-emulations of an FPGA, merging the results produces a full debug view.

The host system receives, from the emulation system, signals traced by the logic of the identified FPGAs during the re-emulation of the component. The host system stores the signals received from the emulator. The signals traced during the re-emulation can have a higher sampling rate than the sampling rate during the initial emulation. For example, in the initial emulation, a traced signal can include a saved state of the component every X milliseconds. However, in the re-emulation, the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterward, the circuit designer can request to re-emulate the same component for a different time period or to re-emulate another component.

A host system 1007 and/or the compiler 1010 may include subsystems such as, but not limited to, a design synthesizer sub-system, a mapping sub-system, a run time sub-system, a results sub-system, a debug sub-system, a waveform sub-system, and a storage sub-system. The sub-systems can be structured and enabled as an individual or multiple modules, or two or more may be structured as a module. Together these sub-systems structure the emulator and monitor the emulation results.

The design synthesizer sub-system transforms the HDL that is representing a DUT 1005 into gate-level logic. For a DUT that is to be emulated, the design synthesizer sub-system receives a description of the DUT. If the description of the DUT is fully or partially in HDL (e.g., RTL or another level of abstraction), the design synthesizer sub-system synthesizes the HDL of the DUT to create a gate-level netlist with a description of the DUT in terms of gate-level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate-level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), a signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states, and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that is associated with the time period.

The debug sub-system transmits the retrieved interface signals to the emulator. The debug sub-system instructs the debug sub-system to use the identified FPGAs and for the trace and injection logic of each identified FPGA to inject its respective traced signals into the logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to use all the cycles collectively.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 11:
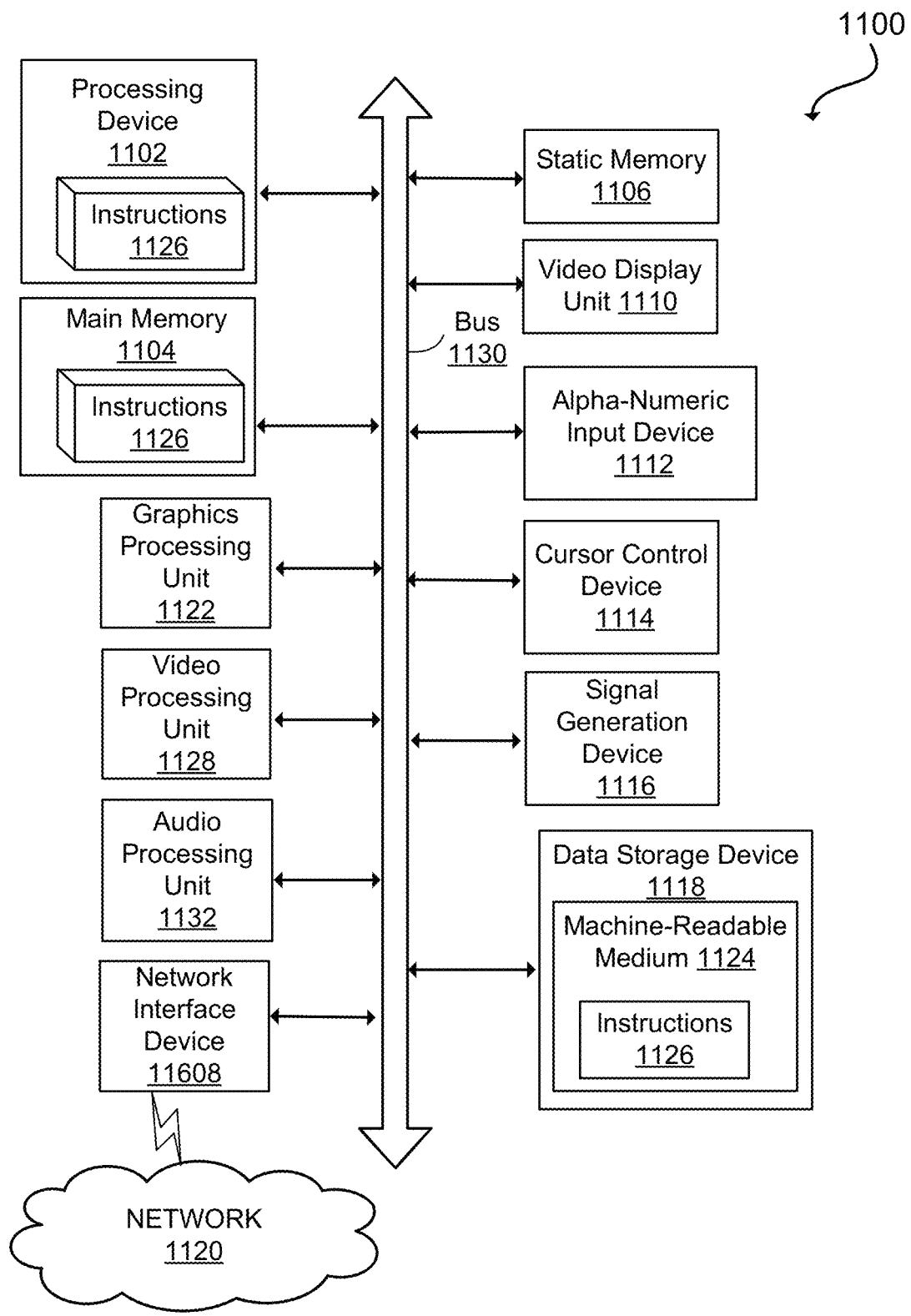
FIG. 11 illustrates an abstract diagram of an example computer system in which aspects of the present disclosure may operate.

FIG. 11 illustrates an example machine of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in a client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

The processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1102 may also be one or more special-purpose processing devices such as an application-specific integrated circuit (ASIC), a field-programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104, and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to the desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer-readable storage medium, such as but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure, as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as read-only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures, and like elements are labeled with like numerals. The disclosure and drawings are, accordingly, to be regarded in an illustrative sense rather than a restrictive sense.

What is claimed:

1. A pseudo-dual-port memory (PDPM), comprising:
   a first memory array bank of a plurality of memory array banks;
   a second memory array bank of the plurality of memory array banks; and
   parallel pin control logic circuitry configured to perform operations comprising:
   taking a clock signal, a memory enable signal for a first port, a memory enable signal for a second port, a parallel pin control signal, and address signals for the first and the second memory array banks as inputs, and
   generating a first internal clock based on the clock signal, the memory enable signal for the first port, and the parallel pin control signal for performing operations corresponding to the first memory array banks at the first port, and a second internal clock based on the clock signal, the memory enable signal for the second port, and the parallel pin control signal for performing operations corresponding to the first and the second memory array bank at the first port and the second port.

2. The PDPM of claim 1, wherein the operations further comprise allowing no operation at the first port and the second port when the memory enable signal for the first port and the memory enable signal for the second port are at a first prespecified level.

3. The PDPM of claim 2, wherein the first prespecified level is level zero.

4. The PDPM of claim 1, wherein the operations further comprise allowing a read operation at the second port when the memory enable signal for the first port is at a first prespecified level and the memory enable signal for the second port is at a second prespecified level.

5. The PDPM of claim 4, wherein the operations further comprise performing a read operation corresponding to the first memory array bank and a read operation corresponding to the second memory array bank in parallel when the parallel pin control signal is at a second prespecified level, wherein the first prespecified level is level zero, and the second prespecified level is level 1.

6. The PDPM of claim 1, wherein the operations further comprise allowing a write operation at the first port when the memory enable signal for the first port is at a second prespecified level, and the memory enable signal for the second port is at a first prespecified level.

7. The PDPM of claim 6, wherein the operations further comprise performing a write operation corresponding to the first memory array bank and a write operation corresponding to the second memory array bank in parallel when the parallel pin control signal is at a second prespecified level, wherein the first prespecified level is level zero, and the second prespecified level is level 1.

8. The PDPM of claim 6, wherein the operations further comprise performing a write operation corresponding to the first memory array bank and a write operation corresponding to the second memory array bank sequentially when the parallel pin control signal is at a first prespecified level, wherein the first prespecified level is level zero, and the second prespecified level is level 1.

9. The PDPM of claim 1, wherein the operations further comprise performing one or more write operations corresponding to the first memory array bank and the second memory array bank in parallel at the first port and one or more read operations corresponding to the first memory array bank and the second memory array bank in parallel at the second port when the memory enable signal for the first port, the memory enable signal for the second port, and the parallel pin control signal are at a second prespecified level, and the address signals for the first memory array bank are different from the address signals for the second memory array bank,
wherein the first prespecified level is level zero, and the second prespecified level is level 1.

10. The PDPM of claim 1, wherein the operations further comprise performing one or more read operations corresponding to the first memory array bank and the second memory array bank in parallel at the second port when the memory enable signal for the first port, the memory enable signal for the second port, and the parallel pin control signal are at a second prespecified level, and the address signals for the first memory array bank and the address signals for the second memory array bank are same,
wherein the first prespecified level is level zero, and the second prespecified level is level 1.

11. The PDPM of claim 1, wherein the operations further comprise performing one or more write operations corresponding to the first memory array bank and the second memory array bank sequentially at the first port and one or more read operations corresponding to the first memory array bank and the second memory array bank based on a priority of the one or more read operations corresponding to the first WL bank and the second memory array bank at the second port when the parallel pin control signal is at a first prespecified level, and the memory enable signal for the first port and the memory enable signal for the second port are at a second prespecified level,
wherein the first prespecified level is level zero, and the second prespecified level is level 1.

12. The PDPM of claim 1, wherein a total number of memory array banks in the plurality of memory array banks is up to eight memory array banks in static random access memory (SRAM) architecture.

13. The PDPM of claim 1, further comprising a clock configured to generate the clock signal, wherein the parallel pin control logic circuitry comprises a plurality of multiplexers and comparator logic circuitry for parallel operations at the first port and the second port at a rising edge of the clock signal.

14. The PDPM of claim 1, wherein the PDPM comprises a pseudo-dual-port static random access memory (PDPSRAM), and
wherein the first memory array bank or the second memory array bank is either a six-transistor (6-T) static random access memory (SRAM) bit-cell or an eight-transistor (8-T) SRAM bit-cell.

15. A non-transitory, tangible computer-readable device having instructions stored thereon that, when executed by at least one computing device, cause the at least one computing device to perform operations comprising:

generating a first internal clock and a second internal clock for performing operations corresponding to a first memory array bank and a second memory array bank of a plurality of memory array banks at a first port and a second port;
performing one or more write operations corresponding to the first memory array bank and the second memory array bank in parallel at the first port; and
performing one or more read operations corresponding to the first memory array bank and the second memory array bank in parallel at the second port,
wherein a memory enable signal for the first port, a memory enable signal for the second port, and a parallel pin control signal are at a first prespecified level, and address signals for the first memory array bank are different from address signals for the second memory array bank, and
wherein the first prespecified level is level 1 or ON.

16. A method for parallel port enablement in pseudo-dual-port memory, the method comprising:
generating a first internal clock and a second internal clock for performing operations corresponding to a first memory array bank and a second memory array bank of a plurality of memory array banks at a first port and a second port;
performing one or more write operations corresponding to the first memory array bank and the second memory array bank in parallel at the first port; and
performing one or more read operations corresponding to the first memory array bank and the second memory array bank in parallel at the second port,
wherein a memory enable signal for the first port, a memory enable signal for the second port, and a parallel pin control signal are at a first prespecified level, and address signals for the first port for the first memory array bank are different from address signals for the second port for the second memory array bank, or vice versa, and
wherein the first prespecified level is level 1 or ON.

17. The method of claim 16, further comprising performing no operation at the first port and the second port when the memory enable signal for the first port and the memory enable signal for the second port are at a second prespecified level,
wherein the second prespecified level is level 0 or OFF.

18. The method of claim 16, further comprising performing one or more read operations at the second port when the memory enable signal for the first port is at a first prespecified level, and the memory enable signal for the second port is at the first prespecified level.

19. The method of claim 16, further comprising:
performing one or more read operations corresponding to the first memory array bank and the second memory array bank in parallel at the second port when the memory enable signal for the first port, the memory enable signal for the second port, and the parallel pin control signal are at the first prespecified level, and the address signals for the first port for the first memory array bank and the address signals for the second port for the second memory array bank, or vice versa are same.

20. The method of claim 16, further comprising:
performing one or more write operations corresponding to the first memory array bank and the second memory array bank sequentially at the first port; and
performing one or more read operations corresponding to the first memory array bank and the second memory array bank based on a priority of the one or more read operations corresponding to the first memory array bank and the second memory array bank at the second port, wherein the parallel pin control signal is at the second prespecified level, and wherein the memory enable signal for the first port and the memory enable signal for the second port are at the first prespecified level.

* * * * *